United States Patent [19]

Jesinger

[11] 4,160,957

[45] Jul. 10, 1979

[54] SIGNAL RE-GENERATION APPARATUS

[75] Inventor: David W. Jesinger, Romsey, England

[73] Assignee: Plessey Handel und Investments AG, Zug, Switzerland

[21] Appl. No.: 866,712

[22] Filed: Jan. 3, 1978

[30] Foreign Application Priority Data

Jan. 4, 1977 [GB] United Kingdom ............... 00008/77

[51] Int. Cl.$^2$ ............................................. H03B 5/30
[52] U.S. Cl. ............................... 331/107 A; 343/6.5 R
[58] Field of Search ......... 343/6.5 R, 6.5 LC, 6.5 SS; 331/107 A; 325/132

[56] References Cited

U.S. PATENT DOCUMENTS

| | | | |
|---|---|---|---|
| 3,225,300 | 12/1965 | Barney et al. | 325/132 |
| 3,921,093 | 11/1975 | Lewis | 331/107 A |
| 3,950,713 | 4/1976 | Lewis | 331/107 A |

OTHER PUBLICATIONS

Electronic Letters, vol. 11, No. 5, pp. 119–120, Mar. 6, 1975, Harteman.

Electronic Letters, vol. 12, No. 2, pp. 39–41, Jan. 22, 1976, Manes.

*Primary Examiner*—John Kominski
*Attorney, Agent, or Firm*—Fleit & Jacobson

[57] ABSTRACT

Jamming arrangements comprising an oscillator including a number of circuits each comprising a surface acoustic wave filter feeding an amplifier responsive only to signals above a predetermined threshold level, the filter characteristics being chosen so that each circuit is responsive to a different range of frequencies, the circuits being connected mutually in parallel and a switch being provided via which the output circuits of the terminals are coupled to the input terminals to define a feedback loop when the switch is closed, the arrangement being such that when the switch is closed and a signal to be jammed is injected into the loop at a frequency within the pass band of at least one of the filters so as to produce a signal which is fed to its associated amplifier above the threshold, oscillation is maintained around the loop at the frequency of the signal to be jammed.

5 Claims, 1 Drawing Figure

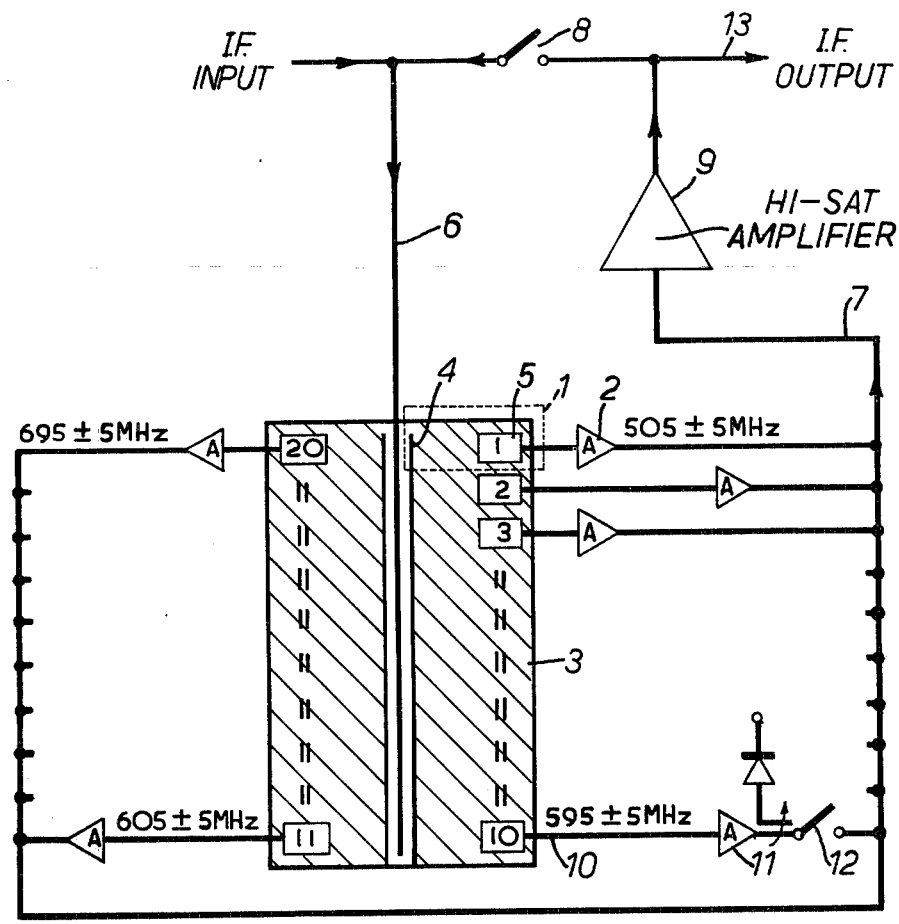

4,160,957

SIGNAL RE-GENERATION APPARATUS

This invention relates to oscillators and more especially it relates to jamming equipment utilising oscillators.

In order to determine the frequency of a signal which is present for a short time period only, such as a radar signal for example which comprises time-spaced bursts of micro-wave energy, it is necessary in known apparatus to measure the frequency of the signal to be jammed and then to steer a transmitter on to this frequency. The foregoing operations pose certain problems especially when a signal to be jammed is present for a very short time period only.

One object of the present invention is to provide a jammer which does not utilise complex frequency measuring and frequency steering systems.

According to the present invention an oscillator arrangement includes a plurality of circuits each comprising a surface acoustic wave filter feeding an amplifier responsive only to signals above a predetermined threshold level, the filter characteristics being chosen so that each circuit is responsive to a different range of frequencies, the circuits being connected mutually and parallel, and switch means via which the output terminals of the circuits are coupled to the input terminals of the circuits to define a feedback loop when the switch means is closed, the arrangement being such that when the switch means is closed and a signal is injected into the loop at a frequency within the pass band of at least one of the filters so as to produce a signal which is fed to its associated amplifier above the said threshold level, oscillation is maintained around the loop at a frequency determined in dependence upon the pass band of the said one of the filters.

The circuits may be arranged to be connected to the switch means via a high saturation amplifier.

The cicuits, or some of the circuits, may each include a switch operative for switching the circuit with which it is associated in or out of the loop.

Preferably a plurality of the surface acoustic wave filters are carried on one substrate of material such as lithium niobate and formed so as to share a common input transducer.

The input transducer may be operatively associated with a plurality of output transducers one for each frequency, arranged in two columns one column being disposed on each side of the input transducer.

Part of the jamming system utilising an oscillator arrangement according to the present invention will now be described by way of example with reference to the accompanying drawing which is a block schematic diagram of an oscillator arrangement.

Referring now to the drawing an oscillator arrangement comprises a plurality of circuits each of which consists of a surface wave filter such as the surface wave filter 1 shown within the broken line and an amplifier such as the amplifier 2. The surface acoustic wave filter 1 is carried on a substrate 3 of lithium niobate and comprises an input transducer shown schematically at 4 and an output transducer 5. In this example twenty filters are formed on the substrate 3 which share a common input transducer fed via the input line 6 each filter covering a different frequency range, the frequency ranges being arranged to overlap.

The delay between input and output transducers is not critical but it determines the bandwidth of the output spectrum and might typically be around 500 n secs. The filters shown each have a bandwidth of about 10 MHz centred on a frequency of 600 MHz so that the total bandwidth covered by the combination of the filters is 200 MHz centred at 600 MHz. An alternative fabrication geometry is possible to that illustrated based on an inclined dispersive input transducer which would enable a 500 MHz bandwidth to be accommodated whilst still remaining within the limitations of simple photo-lithographic reproduction techniques. It will be appreciated that the resolution of 10 MHz mentioned above may be increased or decreased over a wide range and this would of course necessitate modification of the length of the output transducer. The circuits thus formed with a filter such as the filter 1 and an amplifier such as the amplifier 2 are connected in parallel so as to be fed from the input line 6 and so as to feed a common output line 7. The input line 6 and the output line 7 are coupled via a gating switch 8 shown in the open position and a high saturation amplifier 9 to define a feedback loop.

In operation of the circuit, when the switch 8 is closed oscillation does not immediately take place since the amplifiers such as the amplifier 2 are designed to be inoperative until they receive a signal above a predetermined threshold level. When an input signal is applied to the line 6 which is within the bandwidth of one of the surface acoustic wave filters and which has an amplitude sufficient to be above the threshold level of the amplifier associated with that filter, then oscillation takes place around the loop at a frequency determined by the filter concerned.

Thus if for example a radar pulse is received at say a frequency of 595 MHz a signal will pass the filter and appear on output line 10 at an amplitude sufficient to operate the amplifier 11. Each amplifier has associated with it a switch shown schematically at 12 but which in practice comprises a semiconductor pin-diode switch. If the switch 12 is closed, then an output signal will be present on the line 7 which will cause oscillation around the loop assuming that the switch 8 is closed. It will thus be appreciated, that even if a received radar pulse is very short, it will be sensed by the oscillator arrangement just before described and oscillation will thereafter be maintained around the loop and an output signal produced on the line 13 until such time as the switch 8 is opened. In practice each of the amplifiers such as the amplifier 2 or 11 shown would have associated with it a switch similar to the switch 12 so that operation of the arrangement can be effected for example under the control of a computer whereby certain frequencies may be selectively quenched by operation of appropriate switches such as the switch 12. As just before described, each individual circuit amplifier has a threshold characteristic which is similar to the characteristic of amplifiers employed in memory loop so that oscillation cannot commence from noise should the loop gain exceed unity. The common loop amplifier i.e. the high saturation amplifier 9 has a much higher saturation level than the small amplifiers such as the amplifiers 2 and 11 so that in an oscillatory mode no single minor loop incorporating an amplifier and a filter can capture the major loop in which the switch 8 is connected.

While operating in a jamming mode the oscillator arrangement just before described would from part of a repeater which down-converted input signals to the IF band. The oscillations produced in the loop at a frequency close to the input signal can be up-converted in frequency and amplified before being re-transmitted as a jamming signal. This output may be noise modulated to be more effective and this could be simply achieved by (FM) frequency modulating the noise frequency modulation of the up-converting local oscillator.

The arrangement offers advantages other than lower cost and complexity that arise from the way in which new signals may be accepted and existing ones [dumped]. Operation of the quenching gate or switch 8 is similar to operation of the conventional look through mode of current responsive jammers. In the present system however new signals may be accepted at any time the quenching gate or switch 8 is closed and all are lost when the gate is open for a very short period. Retention of any recurring signal occurs as soon as the gate is reclosed.

What we claim is:

1. Signal re-generation apparatus comprising an input terminal means for receiving a signal to be re-generated; a plurality of surface acoustic wave filters connected to said terminal, each said filter having a different pass band; a plurality of threshold amplifier means connected respectively to said filters, one for each said filter, for passing only those signals which are above a predetermined threshold level; an amplifier connected to said threshold amplifier means and having an output coupled to said filters in parallel thereby to define an oscillatory feedback loop; and switch means operatively associated with the loop and effective upon operation to quench oscillation, wherein when a signal to be re-generated is within the pass band of one of the filters and above the predetermined threshold level of the threshold amplifier means and is applied to the input terminal, the threshold amplifier means associated with that filter passes the signal applied thereto so that oscillation takes place around the loop thereby to re-generate the said signal until such time as the said switch means is operated to quench oscillation.

2. Signal re-generation apparatus as claimed in claim 1, comprising a plurality of further switches, each of said further switches operatively associated with each threshold amplifier means and connected in series therewith.

3. Signal re-generation apparatus as claimed in claim 2, wherein said further switches are pin diodes.

4. Signal re-generation apparatus as claimed in claim 2, wherein the said surface acoustic wave filters are carried on one substrate, wherein each surface acoustic wave filter shares a common input transducer and includes separate output transducers, one for each frequency, said output transducers arranged in two columns, each column being disposed on each side of the input transducer, wherein the common input transducer is operatively associated with the output transducers.

5. Signal re-generation apparatus as claimed in claim 1, wherein said amplifier comprises a high saturation amplifier.

* * * * *